(12) United States Patent
Sasaki

(10) Patent No.: US 11,798,609 B2
(45) Date of Patent: Oct. 24, 2023

(54) SEMICONDUCTOR MEMORY DEVICE INCLUDING CONTROL UNIT CONTROLLING TIME INTERVAL OF REFRESH OPERATION ON MEMORY TO SHORTEN INTERVAL BETWEEN MEMORY REFRESH OPERATIONS CORRESPONDING TO READ/WRITE ACCESS REQUIREMENT

(71) Applicant: Winbond Electronics Corp., Taichung (TW)

(72) Inventor: Junichi Sasaki, Yokohama (JP)

(73) Assignee: WINBOND ELECTRONICS CORP., Taichung (TW)

(*) Notice: Subject to any disclaimer, the term of this patent is extended or adjusted under 35 U.S.C. 154(b) by 68 days.

(21) Appl. No.: 17/395,667

(22) Filed: Aug. 6, 2021

(65) Prior Publication Data

US 2023/0042731 A1 Feb. 9, 2023

(51) Int. Cl.
*G11C 11/406* (2006.01)

(52) U.S. Cl.
CPC ................ *G11C 11/406* (2013.01)

(58) Field of Classification Search
CPC .............. G11C 11/406; G11C 11/40611
USPC .......................................... 365/222, 189.01
See application file for complete search history.

(56) References Cited

U.S. PATENT DOCUMENTS

| 9,911,485 B2 * | 3/2018 | Sriramagiri ....... G11C 11/40615 |
| 10,665,273 B2 | 5/2020 | Kim et al. |
| 2003/0076725 A1 * | 4/2003 | Hush ................. G11C 11/406 365/222 |
| 2006/0085616 A1 | 4/2006 | Zeighami et al. |
| 2018/0218767 A1 | 8/2018 | Wolff |
| 2022/0068362 A1 * | 3/2022 | Sato ................. G11C 11/4096 |

FOREIGN PATENT DOCUMENTS

| CN | 109408258 A | 3/2019 |
| JP | 2014-59831 A | 4/2014 |
| JP | 2015-162253 A | 9/2015 |
| KR | 10-2012-0120211 A | 11/2012 |
| KR | 10-2015-0018176 A | 2/2015 |
| TW | 201926338 A | 7/2019 |
| TW | 201944413 A | 11/2019 |

OTHER PUBLICATIONS

Japanese Office Action for corresponding Japanese Application No. 2021-010986, dated Jan. 4, 2022, with English translation.
Korean Office Action for corresponding Korean Application No. 10-2021-0031683, dated Jan. 13, 2022, with English translation.

* cited by examiner

*Primary Examiner* — Connie C Yoha
(74) *Attorney, Agent, or Firm* — Birch, Stewart, Kolasch & Birch, LLP

(57) ABSTRACT

A semiconductor memory device is provided. The semiconductor memory device can suppress increases in power consumption. As a result, damage to the data normally caused by row problems can be prevented. The semiconductor memory device includes a control unit. The control unit controls the time interval for refreshing the memory. If the frequency of a read/write access requirement to the memory during a predetermined period is higher, then the control unit shortens the interval between memory refresh operations.

10 Claims, 12 Drawing Sheets

Fig. 9(a)

| RFA<1:0> | ACCFREQ(BLOCK) : Low (low frequency) | | | |
|---|---|---|---|---|
| | 0 | 1 | 2 | 3 |
| CNT=0 | perform refresh | skip | skip | skip |
| CNT=1 | skip | perform refresh | skip | skip |
| CNT=2 | skip | skip | perform refresh | skip |
| CNT=3 | skip | skip | skip | perform refresh |

Fig. 9(b)

| RFA<1:0> | ACCFREQ(BLOCK) : Middle (middle frequency) | | | |
|---|---|---|---|---|
| | 0 | 1 | 2 | 3 |
| CNT=0 | perform refresh | skip | perform refresh | skip |
| CNT=1 | skip | perform refresh | skip | perform refresh |
| CNT=2 | perform refresh | skip | perform refresh | skip |
| CNT=3 | skip | perform refresh | skip | perform refresh |

Fig. 9(c)

| RFA<1:0> | ACCFREQ(BLOCK) : High (high frequency) | | | |
|---|---|---|---|---|
| | 0 | 1 | 2 | 3 |
| CNT=0 | perform refresh | perform refresh | perform refresh | perform refresh |
| CNT=1 | perform refresh | perform refresh | perform refresh | perform refresh |
| CNT=2 | perform refresh | perform refresh | perform refresh | perform refresh |
| CNT=3 | perform refresh | perform refresh | perform refresh | perform refresh |

SEMICONDUCTOR MEMORY DEVICE INCLUDING CONTROL UNIT CONTROLLING TIME INTERVAL OF REFRESH OPERATION ON MEMORY TO SHORTEN INTERVAL BETWEEN MEMORY REFRESH OPERATIONS CORRESPONDING TO READ/WRITE ACCESS REQUIREMENT

BACKGROUND OF THE INVENTION

Field of the Invention

The present invention relates to a semiconductor memory device.

Description of the Related Art

DRAM (dynamic random access memory) is a volatile memory which stores information by accumulating electric charges in the capacitor. Once the supply of power is interrupt, the stored information is lost. Since the electric charge accumulated in the capacitor is discharged after a certain period of time, the DRAM needs to be charged periodically. This memory-retention operation is called a "refresh".

However, during the refresh period, if the read and/or write access requirements for the same row address are required multiple times, and the read and/or write access requirements for the same row address are required too frequently, "row hammer" may occur. Row hammer is a problem wherein, for a certain period of time, if the read/write access requirements for the same row address are required multiple times, and the read/write access requirements for the same row address are required too frequently, the data will be damaged due to the discharge of the electric charge of the data bit corresponding to the adjacent row address, and the adjacent row address is adjacent to the row address for which the read/write access requirements are required.

To solve the problem of row hammer, some people have considered using a shorter refresh interval for the memory. However, when this is done, the refresh operations are performed frequently, with a very short time interval in between them, and so the power consumption of the semiconductor memory device increases.

The purpose of the present invention is to provide a semiconductor memory device that can suppress any increase in power consumption, which can prevent damage to the data caused by row hammer.

BRIEF SUMMARY OF THE INVENTION

The present invention provides a semiconductor memory device. The semiconductor memory device comprises a control unit. The control unit controls the interval at which a refresh operation is performed on the memory. If the frequency of a read/write access requirement to the memory during a predetermined period is higher, then the control unit shortens the interval of the memory refresh operation.

The semiconductor memory device according to the present invention can suppress any increase in power consumption, which can help protect data from damage due to row hammer.

BRIEF DESCRIPTION OF THE DRAWINGS

FIGS. 9(a)-9(c) show the configuration of the lookup tables.

DETAILED DESCRIPTION OF THE INVENTION

The semiconductor memory device according to the following embodiments of the present invention will be described in detail with reference to the attached drawings. However, the embodiments are illustrative examples, and the present invention is not limited to them.

Figure 1:
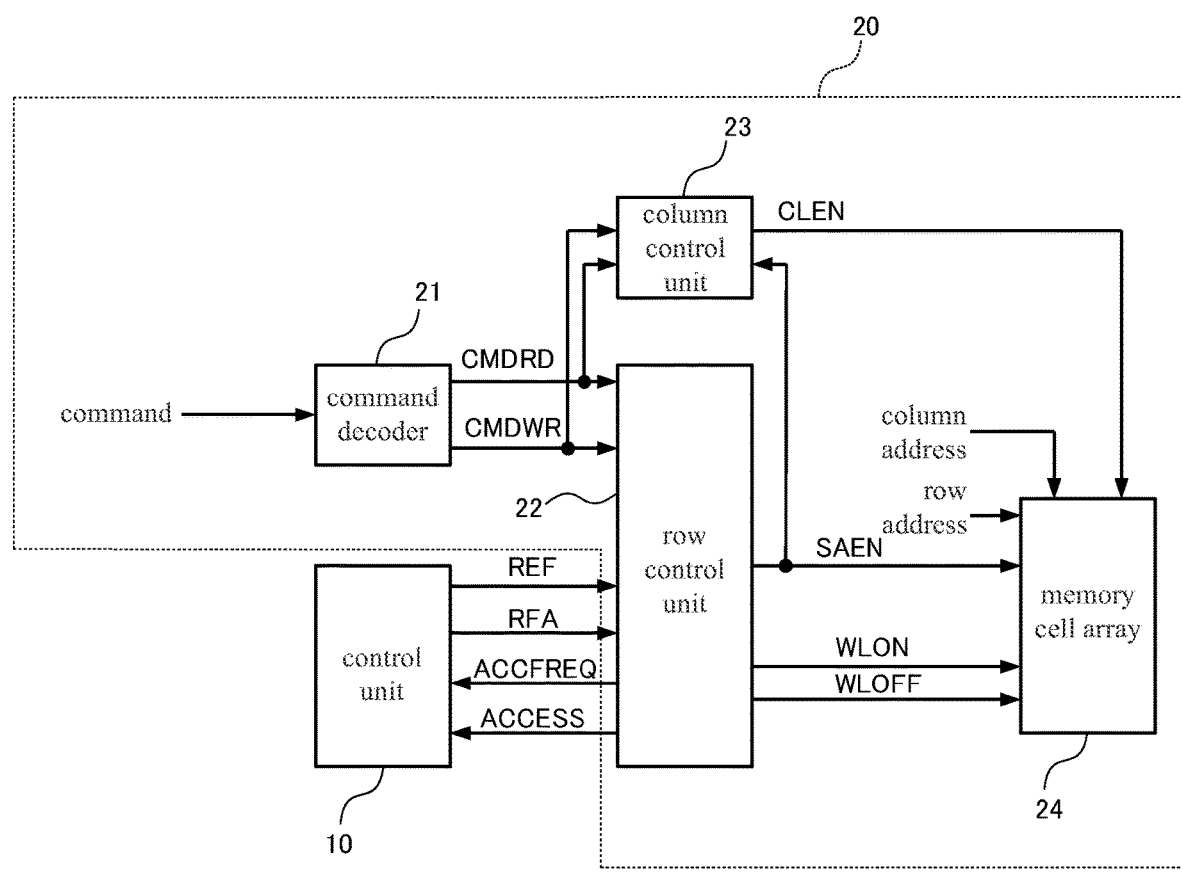
FIG. 1 is a block diagram showing the configuration of the semiconductor memory device according to the first embodiment of the present invention.

FIG. 1 is a block diagram showing the configuration of the semiconductor memory device according to the first embodiment of the present invention. The semiconductor memory device comprises a control unit 10 and a memory 20. The control unit 10 and the memory 20 can be configured by the specific hardware device or the logic circuit.

In one embodiment, the semiconductor memory device can be a pSRAM (pseudo-static random access memory) which the refresh operation is controlled internally. Generally, a conventional DRAM comprises a specific circuit that solves the problem of row hammer by registering the disturb word line address, or using an added refresh operation to recover the data. However, compared to conventional DRAM, the pSRAM is continually being miniaturized, so it is difficult to make sure that there is sufficient space for such a specific circuit. In addition, if such a specific circuit is configured in the pSRAM, the cost of the pSRAM may be too high. Therefore, is the present invention is applied to pSRAM, without configuring such a specific circuit, the increase in power consumption can be suppressed, and data damage due to row hammer can be avoided.

Referring to FIG. 1, the control unit 10 controls the interval of the refresh operation for the memory 20. In one embodiment, if the frequency of the read/write access requirement to the memory 20 during the predetermined period is higher, then the control unit 10 shortens the interval of the memory refresh operation. In another embodiment, if the frequency of the read/write access requirement to the memory during the predetermined period is higher, then the control unit 10 can also shorten the interval of the refresh requirement (in the present embodiment, the refresh signal REF is described later). The refresh requirement is generated at regular intervals in order to refresh the memory 20. This way, if the frequency of the read/write access requirement to the memory 20 during the predetermined period is higher, then refresh requirements can be generated at shorter intervals. Therefore, the refresh operation for the memory 20 can be performed more frequently, which can help protect data from damage due to row hammer. In addition, the detailed configuration of the control unit 10 will be described later.

Continuing to refer to FIG. 1, the memory 20 is a semiconductor memory (for example, DRAM, etc.) which needs to be refreshed. The memory 20 comprises a command decoder 21, a row control unit 22, a column control unit 23 and a memory cell array 24. The command decoder 21 interprets the command signal provided externally, and generates a command control signal. For example, if the command signal provided externally is a read command, then the command decoder 21 outputs the trigger signal CMDRD of the read operation to the row control unit 22 and the column control unit 23. In addition, if the command signal provided externally is a write command, then the command decoder 21 outputs the trigger signal CMDWR of the write operation to the row control unit 22 and the column control unit 23.

The row control unit 22 controls the corresponding memory array in the memory cell array 24, and enables/disables the corresponding memory array in the memory cell array 24 according to the trigger signals CMDRD, CMDWR and the refresh signal REF described later. For example, the row control unit 22 outputs the signal WLON for enabling the row word line and the signal WLOFF for disabling the row word line to the memory cell array 24, such to select the word line for read, write or performing refresh operation.

In addition, the row control unit 22 outputs the signal SAEN for enabling the sense amplifier to the memory cell array 24 and the column control unit 23.

In addition, the row control unit 22 outputs the signal ACCESS indicating the read/write access requirement and the signal ACCFREQ indicating the frequency of the read/write access requirement to the memory cell array 24 to the control unit 10. Here, the frequency of the read/write access requirement to the memory cell array 24, for example, can be obtained by using a counter (not shown in the figure) configured in the row control unit 22 to count the trigger signals CMDRD and CMDWR. The row control unit 22 can also output the signal ACCFREQ indicating the frequency (for example, when the frequency is less than a first threshold value, it is "low"; when the frequency is greater than or equal to the first threshold value and is less than a second value, it is "middle"; when the frequency is greater than or equal to the second value, it is "high") of the read/write access requirement during the predetermined period to the control unit 10 at every predetermined period (the first threshold value is less than the second value).

In addition, if the refresh signal REF at the high level is input from the control unit 10, then the row control unit 22 performs the refresh operation on the row address indicated by the refresh address signal RFA output from the control unit 10.

The column control unit 23 outputs the signal CLEN for enabling the column bit line to the memory cell array 24 according to the trigger signals CMDRD and CMDWR, such to select the column bit line for read/write access.

In addition, the address and data control of the memory cell array 24 are also well-known technologies, so descriptions of them are omitted from the present embodiment.

In the present embodiment, a memory 20 comprising a command decoder 21, a row control unit 22, a column control unit 23 and a memory cell array 24 is described as an example. However, when the memory 20 exists outside the semiconductor memory device, at least one of the units 21 to 24 can also be configured together with the control unit 10 in the semiconductor memory device.

Figure 2:
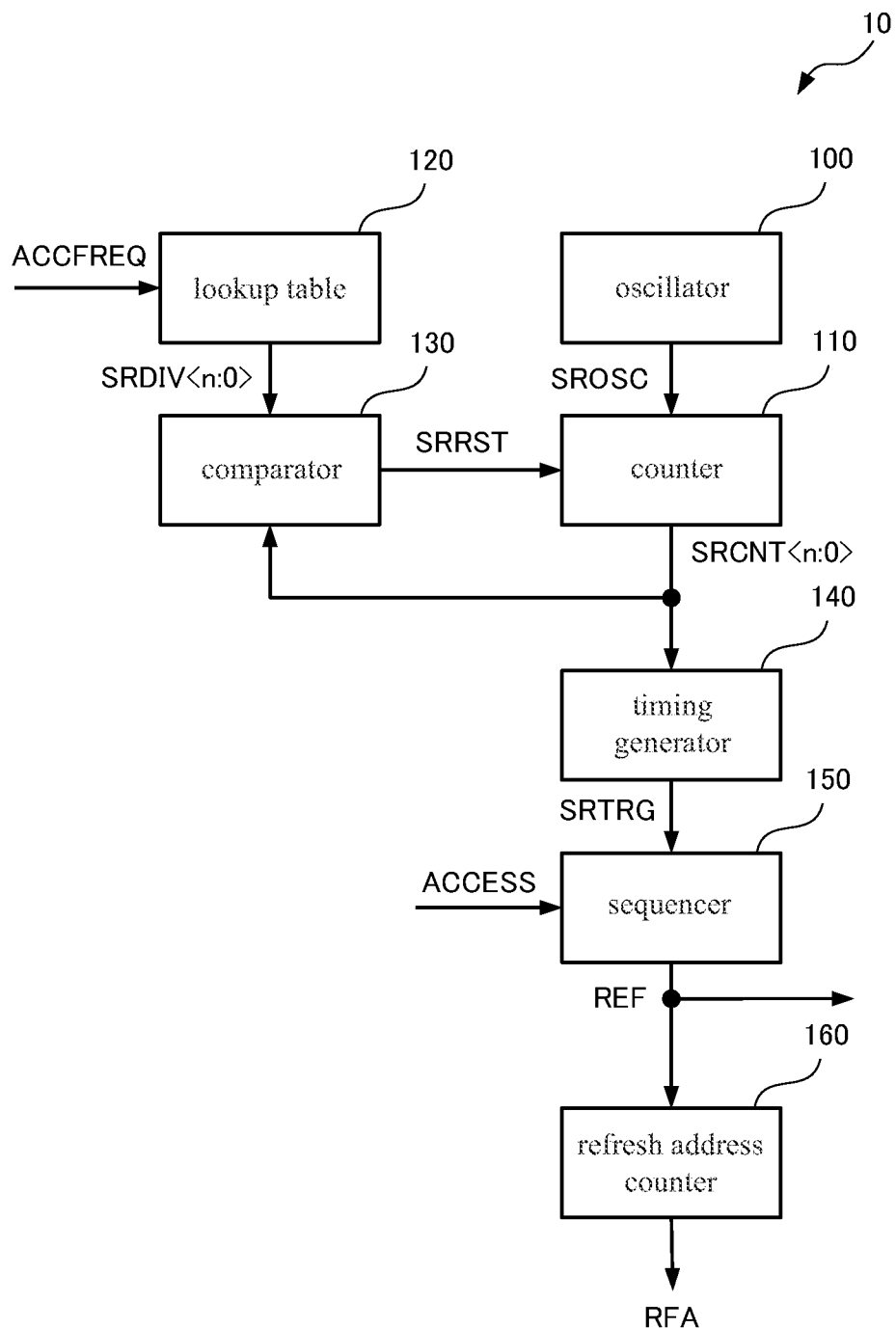
FIG. 2 shows an example of the configuration of the control unit.

The configuration of the control unit 10 will be described with reference to FIG. 2. The control unit 10 comprises an oscillator 100, a counter 110, a lookup table 120, a comparator 130, a timing generator 140, a sequencer 150 and a refresh address counter 160. The oscillator 110 generates an oscillating signal SROSC for the refresh operation at a predetermined interval and outputs the oscillating signal SROSC to the counter 110.

The counter 110 counts the pulses of the oscillating signal SROSC output from the oscillator 100, and outputs the n+1 bits (n is a positive integer) signal SRCNT<n:0> indicating the count value of the pulses to the comparator 130 and the timing generator 140. In addition, when the signal SRRST for resetting the count value to the default value (such as 0) is input to the comparator 130, the counter 110 resets the count value to the default value.

Every time the signal ACCFREQ indicating the frequency of the read/write access during the predetermined period is input from the control unit 22, the lookup table 120 outputs the n+1 bits (n is a positive integer) signal SRDIV<n:0> indicating the number of pulses of the oscillating signal SROSC corresponding to the signal ACCFREQ to the comparator 130. Here, the lookup table 120 can also correspond to different number of pulses according to the frequency of the read/write access during the predetermined period. In addition, the lookup table 120 can also be designed such that if the frequency of the read/write access during the predetermined period is lower, then the number of pulses of the oscillating signal SROSC becomes more.

In addition, in the present embodiment, if the signal ACCFREQ indicates low frequency (Low), then the lookup table 120 outputs the signal SRDIV<n:0> indicating that the number of pulses is 12 to the comparator 130; if the signal ACCFREQ indicates middle frequency (Middle), then the lookup table 120 outputs the signal SRDIV<n:0> indicating that the number of pulses is 6 to the comparator 130; if the signal ACCFREQ indicates high frequency (High), then the lookup table 120 outputs the signal SRDIV<n:0> indicating that the number of pulses is 3 to the comparator 130.

Figure 3:
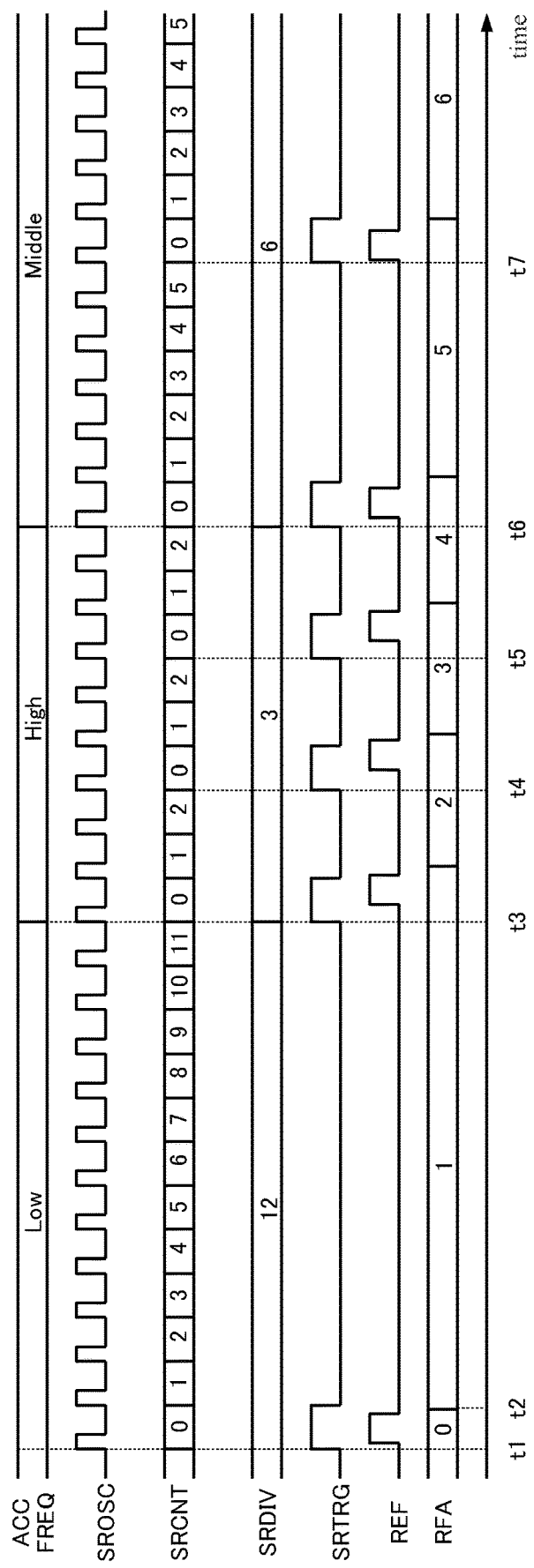
FIG. 3 is a timing chart showing changes in the voltage of the signal of every unit inside the semiconductor memory device according to the first embodiment.

When the signal SRCNT<n:0> indicating the number of pluses of the oscillating signal SROSC is input from the counter 110, the comparator 130 compares the number of pluses of the oscillating signal SROSC (for example, 1 plus the value of the signal SRCNT<n:0> shown in FIG. 3) with the signal SRDIV<n:0> input from the lookup table 120. Next, if the number of pluses of the oscillating signal SROSC matches the value of the signal SRDIV<n:0>, then the comparator 130 outputs the signal SRRET to the counter 110.

When the value of the signal SRCNT<n:0> output from the counter 110 is 0, the timing generator 140 outputs the refresh trigger signal SRTRG at the high level to the sequencer 150.

When the refresh trigger signal SRTRG at the high level is input from the timing generator 140, the sequencer 150 outputs the refresh signal REF at the high level to the refresh address counter 160 and the row control unit 22. In addition, for example, if the signal ACCESS indicating the read/write access requirement and the refresh trigger signal SRTRG at the high level are almost input at the same time, the sequencer 150 can also perform arbitration between the signals ACCESS and SRTRG, and adjust the timing that the refresh signal REF is output.

The refresh address counter 160 outputs the signal RFA indicating the address that has become the target of the refresh operation to the row control unit 22. In addition, every time the refresh operation is performed (that is, the refresh signal REF at the high level is input from the sequencer 150), the refresh address counter 160 increments the row address that has become the target of the refresh operation. For example, the refresh address counter 160 can increment the row address when the refresh signal REF is at the falling edge.

FIG. 3 is a timing chart showing changes in the voltage of the signal of every unit inside the semiconductor memory device according to the present embodiment. At time t1, when the signal ACCFREQ indicating that the frequency of the read/write access during the predetermined period is low frequency (Low) is input to the lookup table 120, the lookup table 120 outputs the signal SRDIV<n:0> indicating the corresponding number of pulses (here, the example is 12) to the comparator 130. In addition, since the value of the signal SRCNT<n:0> is 0, the timing generator 140 outputs the refresh trigger signal SRTRG at the high level to the sequencer 150. Next, the sequencer 150 outputs the refresh signal REF at the high level to the refresh address counter 160 and the row control unit 22. This way, the refresh operation will be performed on the row address indicated by the signal RFA (in the figure, "0"). Next, at time t2 which is at the falling edge of the refresh signal REF, the refresh address counter 160 increments the row address indicated by the signal RFA (in the figure, from "0" to "1").

This way, when the frequency of the read/write access during the predetermined period is low frequency (Low), every time the number of pulses of the oscillating signal SROSC generated by the oscillator 100 reaches 12, one refresh signal REF is generated.

Next, at time t3, when the signal ACCFREQ indicating that the frequency of the read/write access during the predetermined period is high frequency (High) is input to the lookup table 120, the lookup table 120 outputs the signal SRDIV<n:0> indicating the corresponding number of pulses (here, the example is 3) to the comparator 130. In addition, the timing generator 140 outputs the refresh trigger signal SRTRG at the high level to the sequencer 150. Next, the sequencer 150 outputs the refresh signal REF at the high level to the refresh address counter 160 and the row control unit 22. This way, the refresh operation will be performed on the row address indicated by the signal RFA (in the figure, "1"). Next, at the falling edge of the refresh signal REF, the refresh address counter 160 increments the row address indicated by the signal RFA (in the figure, from "1" to "2").

In addition, when the signal SRCNT<n:0> indicating that the number of pulses of the oscillating signal SROSC is 3 is input from the counter, since the number of pulses of the oscillating signal SROSC matches the value of the signal SRDIV<n:0>, the comparator 130 outputs the signal SRRST to the counter. As this time, the counter 110 resets the count value of the pulses of the oscillating signal SROSC to the default value.

Next, at time t4 and t5, by outputting the refresh signal REF at the high level to the refresh address counter 160 and the row control unit 22, the refresh operations will be performed on the row addresses (in the figure, "2" and "3" respectively) indicated by the signal RFA respectively.

This way, when the frequency of the read/write access during the predetermined period is high frequency (High), every time the number of pulses of the oscillating signal SROSC generated by the oscillator 100 reaches 3, one refresh signal REF is generated.

Next, at time t6, when the signal ACCFREQ indicating that the frequency of the read/write access during the predetermined period is middle frequency (Middle) is input to the lookup table 120, the lookup table 120 outputs the signal SRDIV<n:0> indicating the corresponding number of pulses (here, the example is 6) to the comparator 130. In addition, the timing generator 140 outputs the refresh trigger signal SRTRG at the high level to the sequencer 150. Next, the sequencer 150 outputs the refresh signal REF at the high level to the refresh address counter 160 and the row control unit 22. This way, the refresh operation will be performed on the row address indicated by the signal RFA (in the figure, "4"). Next, at the falling edge of the refresh signal REF, the refresh address counter 160 increments the row address indicated by the signal RFA (in the figure, from "4" to "5").

In addition, when the signal SRCNT<n:0> indicating that the number of pulses of the oscillating signal SROSC is 6 is input from the counter, since the number of pulses of the oscillating signal SROSC matches the value of the signal SRDIV<n:0>, the comparator 130 outputs the signal SRRST to the counter. As this time, the counter 110 resets the count value of the pulses of the oscillating signal SROSC to the default value.

Next, at time t7, by outputting the refresh signal REF at the high level to the refresh address counter 160 and the row control unit 22, the refresh operation will be performed on the row address (in the figure, "5") indicated by the signal RFA.

This way, when the frequency of the read/write access during the predetermined period is middle frequency (Middle), every time the number of pulses of the oscillating signal SROSC generated by the oscillator 100 reaches 6, one refresh signal REF is generated.

In addition, in the present embodiment, one example describes that when the value of the signal SRCNT<n:0> is the default value (here, the example is 0), the refresh operation will be performed; however, the present invention is not limited to this. For example, the refresh operation can also be performed when the value of the signal SRCNT<n:0> is other than 0.

As described above, in the present embodiment, if the frequency of the read/write access requirement to the memory during the predetermined period is higher, the refresh requirement (here, refresh signal REF) can be generated at the shorter interval.

As described above, according to the present embodiment of the semiconductor memory device, for example, when the read/write access is frequently required during the predetermined period, the refresh operation for the memory 20 can be frequently performed accordingly. This way, it can help protect data from damage due to row hammer. On the other hand, if the frequency of the read/write access requirement during the predetermined period is lower, then the refresh operation for the memory 20 can be performed at the longer interval. Therefore, the refresh operation can be performed fewer times than is necessary when the refresh operation is performed at the shortest interval. This helps ensure that there is no increase in power consumption on the part of the semiconductor memory device.

Next, the second embodiment of the present invention will be described. The difference from the first embodiment is that if the frequency of the read/write access requirement to the memory 20 during the predetermined period is higher, then the control unit 10 increases the number of times that the refresh operation is performed according to the refresh requirement. The refresh requirement is generated at regular intervals in order to refresh the memory 20. Next, the configuration different from the first embodiment will be described.

Figure 4:
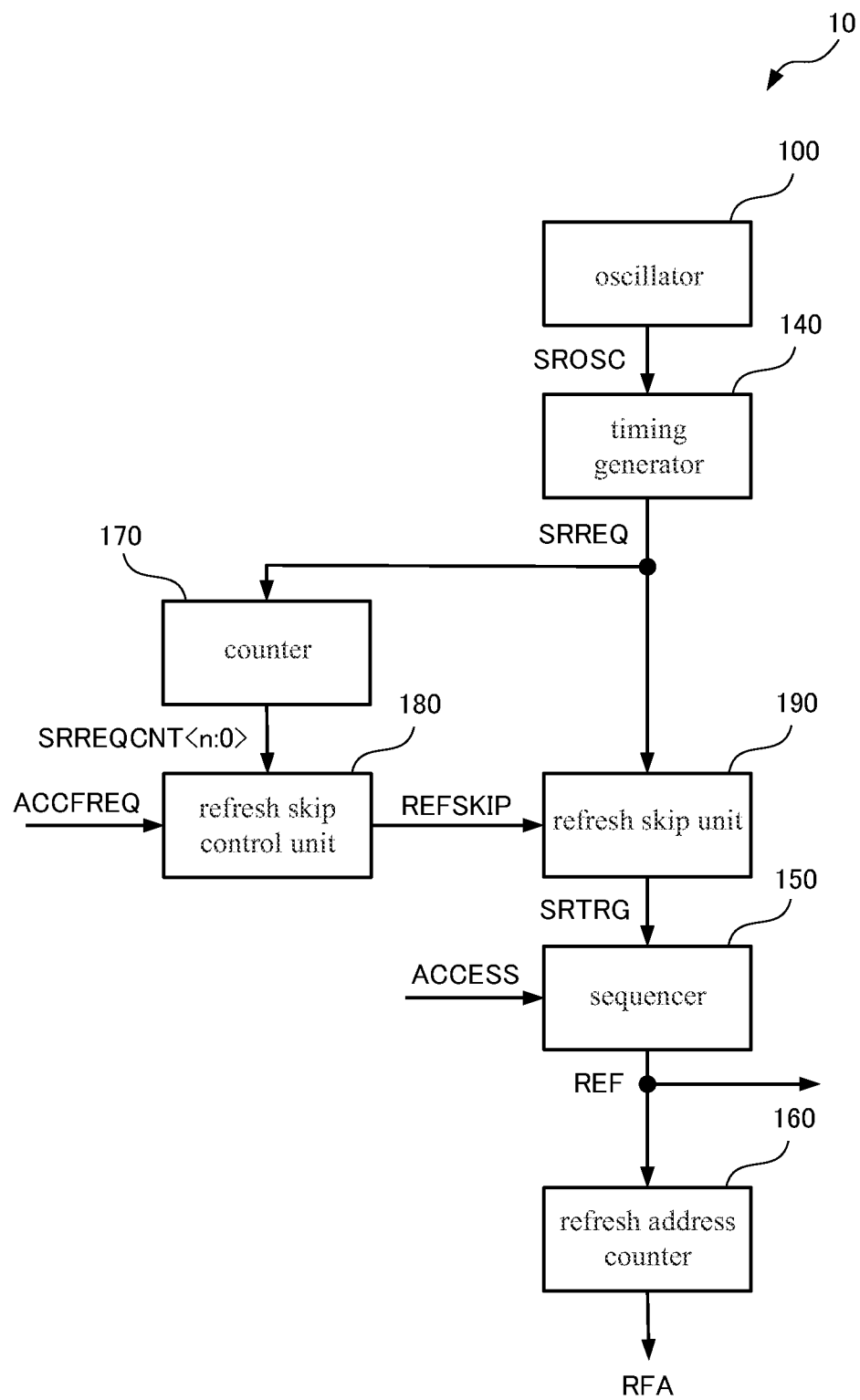
FIG. 4 is a block diagram showing the configuration of the control unit in the semiconductor memory device according to the second embodiment of the present invention.

FIG. 4 shows the configuration of the control unit 10 according to the second embodiment. In the present embodiment, the control unit 10 comprises an oscillator 100, a timing generator 140, a sequencer 150, a refresh address counter 160, a counter 170, a refresh skip control unit 180 and a refresh skip unit 190. Here, the configurations of the oscillator 100, the sequencer 150 and the refresh address counter 160 are the same as the first embodiment described above.

In the present embodiment, every time the oscillating signal SROSC is input from the oscillator 100, the timing generator 140 can also output the refresh requirement signal SRREQ which the pulses are the same as the oscillating signal SROSC to the counter 170 and the refresh skip unit 190.

The counter 170 counts the pulses of the refresh requirement signal SRREQ output from the timing generator 140, and outputs the n+1 bits (n is a positive integer) signal SRREQCNT<n:0> indicating the count value of the pulses to the refresh skip control unit 180. In addition, when the signal (not shown in the figure) for resetting the count value to the default value (such as 0) is input from the refresh skip control unit 180, the counter 170 can also reset the count value to the default value.

When the signal SRREQCNT<n:0> having a default value is input from the counter 170, the refresh skip control unit 180 outputs the refresh skip signal REFSKIP at the high level to the refresh skip unit 190. In addition, every time the number of pulses of the refresh requirement signal SRREQ indicated by the signal SRREQCNT<n:0> reaches the number of pulses corresponding to the access frequency indicated by the signal ACCFREQ input from the row control unit 22, the refresh skip control unit 180 can also output the signal for resetting the count value to the default value (not shown in the figure) to the counter 170. Here, the number of pulses corresponding to the access frequency indicated by the signal ACCFREQ can also be designed such that if the frequency of the read/write access during the predetermined period is lower, then the number of pulses becomes more. The above design is the same as the lookup table 120 described above.

If the refresh skip signal REFSKIP at the low level is input from the refresh skip control unit 180, then the refresh skip unit 190 converts the refresh requirement signal SRREQ output from the timing generator 140 to the refresh trigger signal SRTRG at the low level, and outputs the refresh trigger signal SRTRG to the sequencer 150. In addition, if the refresh skip signal REF SKIP at the high level is input from the refresh skip control unit 180, then the refresh skip unit 190 converts the refresh requirement signal SRREQ output from the timing generator 140 to the refresh trigger signal SRTRG at the high level, and outputs the refresh trigger signal SRTRG to the sequencer 150.

Figure 5:
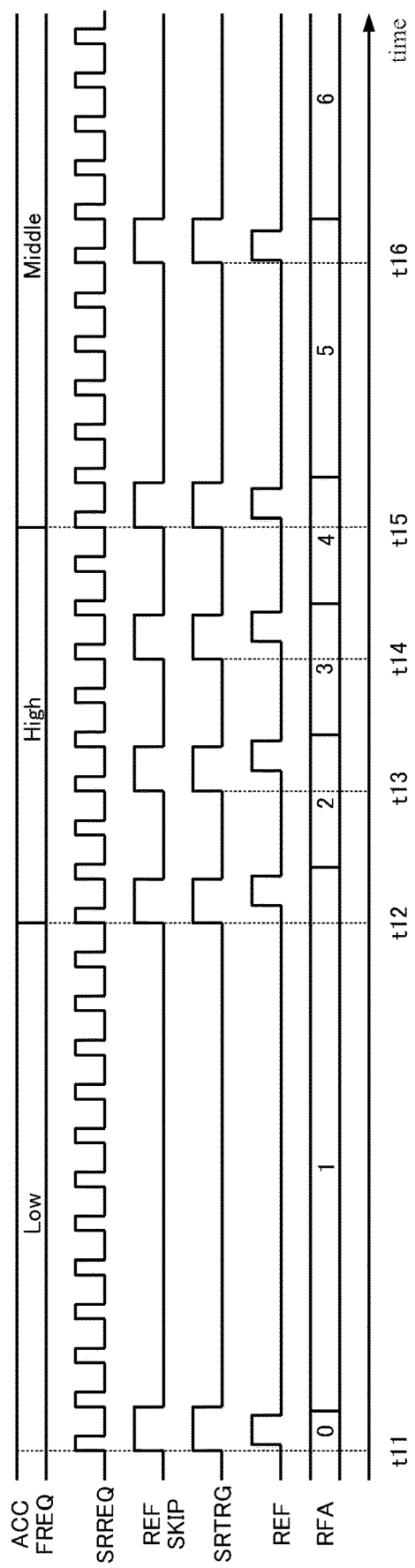
FIG. 5 is a timing chart showing changes in the voltage of the signal of every unit inside the semiconductor memory device according to the second embodiment.

FIG. 5 is a timing chart showing changes in the voltage of the signal of every unit inside the semiconductor memory device according to the present embodiment. At time t11, when the signal ACCFREQ indicating that the frequency of the read/write access during the predetermined period is low frequency (Low) is input, the signal SRREQCNT<n:0> having the default value is input from the counter 170, and the refresh skip control unit 180 outputs the refresh skip signal REFSKIP at the high level to the refresh skip unit 190.

In addition, since the refresh skip signal REFSKIP at the high level is input from the refresh skip control unit 180, the refresh skip unit 190 converts the refresh requirement signal SRREQ output from the timing generator 140 to the refresh trigger signal SRTRG at the high level, and outputs the refresh trigger signal SRTRG to the sequencer 150. In addition, the sequencer 150 outputs the refresh signal REF at the high level to the refresh address counter 160 and the row control unit 22. This way, the refresh operation will be performed on the row address indicated by the signal RFA (in the figure, "0"). In addition, at the falling edge of the refresh signal REF, the refresh address counter 160 increments the row address indicated by the signal RFA (in the figure, from "0" to "1").

This way, when the frequency of the read/write access during the predetermined period is low frequency (Low), every time a certain number (in the figure, the certain number is 12) of the refresh requirement signal SRREQ are generated, one refresh signal REF is generated (that is, the refresh operation is performed once).

Next, at time t12, when the signal ACCFREQ indicating that the frequency of the read/write access during the predetermined period is high frequency (High) is input, the signal SRREQCNT<n:0> having the default value is input from the counter 170, and the refresh skip control unit 180 outputs the refresh skip signal REFSKIP at the high level to the refresh skip unit 190. In addition, the refresh skip unit 190 converts the refresh requirement signal SRREQ output from the timing generator 140 to the refresh trigger signal SRTRG at the high level, and outputs the refresh trigger signal SRTRG to the sequencer 150. In addition, the sequencer 150 outputs the refresh signal REF at the high level to the refresh address counter 160 and the row control unit 22. This way, the refresh operation will be performed on the row address indicated by the signal RFA (in the figure, "1"). In addition, at the falling edge of the refresh signal REF, the refresh address counter 160 increments the row address indicated by the signal RFA (in the figure, from "1" to "2").

In addition, when the number of pulses of the refresh requirement signal SRREQ indicated by the signal SRREQCNT<n:0> reaches the number of pulses corresponding to the access frequency indicated by the signal ACCFREQ input from the row control unit 22 (in the FIG. 3), the refresh skip control unit 180 outputs the signal for resetting the count value to the default value (not shown in the figure) to the counter 170. As this time, the counter 170 resets the count value of the pulses of the refresh requirement signal SRREQ to the default value.

Next, at time t13 and t14, by outputting the refresh signal REF at the high level to the refresh address counter 160 and the row control unit 22, the refresh operations will be performed on the row addresses (in the figure, "2" and "3" respectively) indicated by the signal RFA respectively.

This way, when the frequency of the read/write access during the predetermined period is high frequency (High), every time a certain number (in the figure, the certain number is 3) of the refresh requirement signal SRREQ are generated, one refresh signal REF is generated (that is, the refresh operation is performed once).

Next, at time t15, when the signal ACCFREQ indicating that the frequency of the read/write access during the predetermined period is middle frequency (Middle) is input, the signal SRREQCNT<n:0> having the default value is input from the counter 170, and the refresh skip control unit 180 outputs the refresh skip signal REFSKIP at the high level to the refresh skip unit 190. In addition, the refresh skip unit 190 converts the refresh requirement signal SRREQ output from the timing generator 140 to the refresh trigger signal SRTRG at the high level, and outputs the refresh trigger signal SRTRG to the sequencer 150. In addition, the sequencer 150 outputs the refresh signal REF at the high level to the refresh address counter 160 and the row control unit 22. This way, the refresh operation will be performed on the row address indicated by the signal RFA (in the figure, "4"). In addition, at the falling edge of the refresh signal REF, the refresh address counter 160 increments the row address indicated by the signal RFA (in the figure, from "4" to "5").

In addition, when the number of pulses of the refresh requirement signal SRREQ indicated by the signal SRREQCNT<n:0> reaches the number of pulses corresponding to the access frequency indicated by the signal ACCFREQ input from the row control unit 22 (in the FIG. 6), the refresh skip control unit 180 outputs the signal for resetting the count value to the default value (not shown in the figure) to the counter 170. As this time, the counter 170 resets the count value of the pulses of the refresh requirement signal SRREQ to the default value.

Next, at time t16, by outputting the refresh signal REF at the high level to the refresh address counter 160 and the row control unit 22, the refresh operation will be performed on the row address (in the figure, "5") indicated by the signal RFA.

This way, when the frequency of the read/write access during the predetermined period is middle frequency (Middle), every time a certain number (in the figure, the certain number is 6) of the refresh requirement signal SRREQ are generated, one refresh signal REF is generated (that is, the refresh operation is performed once).

In addition, in the present embodiment, one example describes that when the value of the signal SRCNT<n:0> is the default value (here, the example is 0), the refresh operation will be performed; however, the present invention is not limited to this. For example, the refresh operation can also be performed when the value of the signal SRCNT<n:0> is other than 0.

As described above, according to the present embodiment of the semiconductor memory device, when the frequency of the read/write access requirement to the memory is higher, then the number refresh operations that are performed can be increased according to the refresh requirement signal SRREQ, which is generated at regular intervals. That is, it can increase the number of times that the refresh operation is performed. This way, the memory can be refreshed frequently, which can help protect data from damage due to row hammer.

Next, the third embodiment of the present invention will be described. The difference from the above embodiments is that the control unit 10 controls the refresh-operation interval for each block in a continuous row address. Next, a different configuration from the one described in the embodiments above will be described below.

In the present embodiment, the semiconductor memory device comprises a plurality of blocks (here, the example is 4). Each of the blocks comprises a refresh address counter, and each refresh address counter designates the row address where the refresh operation is performed according to the refresh requirement. In addition, the control unit 10 controls the refresh operations to be performed on the corresponding row address designated by the refresh address counter of each corresponding block. This way, when the refresh operation is performed on any of the blocks, the row address of the refresh operation can be easily designated by using the refresh address counter. In addition, among the blocks, the number of continuous row addresses in each block can be the same or different.

Figure 6:
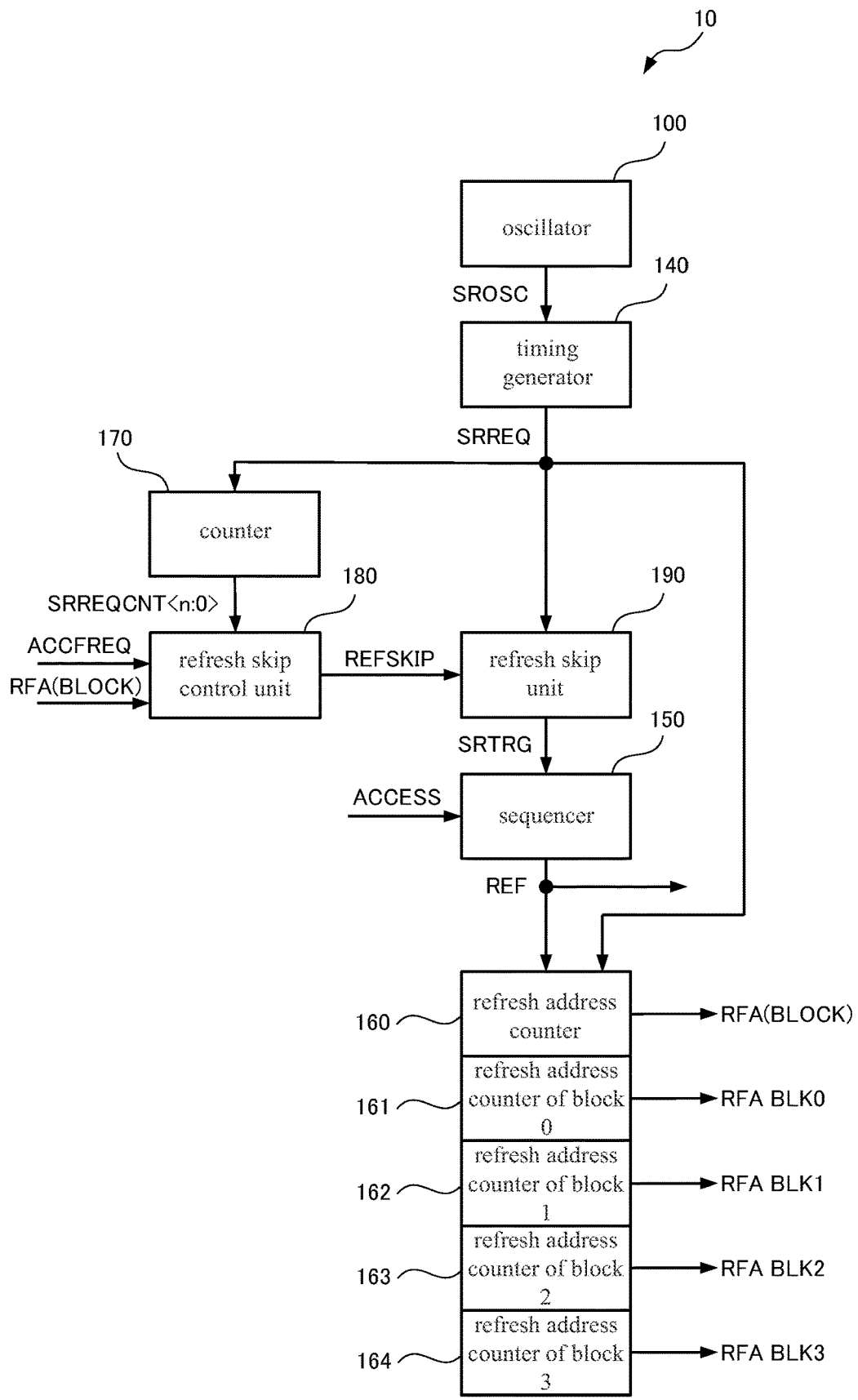
FIG. 6 is a block diagram showing the configuration of the control unit in the semiconductor memory device according to the third embodiment of the present invention.

FIG. 6 shows the configuration of the control unit 10 according to the third embodiment. In the present embodiment, the control unit 10 comprises an oscillator 100, a timing generator 140, a sequencer 150, a refresh address counter 160, refresh address counters 161, 162, 163 and 164 which are separately configured in each of a plurality of blocks (in the figure, there are four blocks, which are blocks 0-3), a counter 170, a refresh skip control unit 180 and a refresh skip unit 190. Here, the configurations of the oscillator 100, the timing generator 140, the sequencer 150, the counter 170 and the refresh skip unit 190 are the same as the second embodiment described above.

In the present embodiment, the refresh address counter 160 can also be designed such that the refresh requirement signal SRREQ is input from the timing generator. In this case, the refresh address counter 160 can also count the number of pulses of the refresh requirement signal SRREQ such that the number of pulses repeats in a certain count range (for example, from 0 to 3). In addition, for example, every time the number of the rising edge of the pulses of the refresh requirement signal SRREQ is counted from No. 0 to a certain number (for example, No. 3), the refresh address counter 160 can also output a signal RFA(BLOCK) to the refresh skip control unit 180. The signal RFA(BLOCK) is used for shifting one block that has become the target of the refresh operation to another block. In addition, during the signal RFA(BLOCK) is output, the refresh address counter 160 outputs the refresh signal REF input from the sequencer 150 to a refresh address counter (for example, refresh address counter 161) corresponding to a block (for example, block 0) designated by the signal RFA(BLOCK) among the refresh address counters 161-164.

The refresh address counter 161 of the block 0 outputs the signal RFA BLK0 indicating that the block 0 has become the target of the refresh operation to the row control unit 22. In addition, every time the refresh operation is performed on the block 0, the refresh address counter 161 increments the row address in the block 0 which has become the target of the refresh operation. The refresh address counter 162 of the block 1 outputs the signal RFA BLK0 indicating that the block 1 has become the target of the refresh operation to the row control unit 22. In addition, every time the refresh operation is performed on the block 1, the refresh address counter 162 increments the row address in the block 1 which has become the target of the refresh operation. The refresh address counter 163 of the block 2 outputs the signal RFA BLK0 indicating that the block 2 has become the target of the refresh operation to the row control unit 22. In addition, every time the refresh operation is performed on the block 2, the refresh address counter 163 increments the row address in the block 2 which has become the target of the refresh operation. The refresh address counter 164 of the block 3 outputs the signal RFA BLK0 indicating that the block 3 has become the target of the refresh operation to the row control unit 22. In addition, every time the refresh operation is performed on the block 3, the refresh address counter 164 increments the row address in the block 3 which has become the target of the refresh operation.

In the present embodiment, when the signal SRREQCNT<n:0> having the default value is input from the counter 170, the refresh skip control unit 180 outputs the refresh skip signal REFSKIP at the high level to the refresh skip unit 190. In addition, every time the number of pulses of the refresh requirement signal SRREQ indicated by the signal SRREQCNT<n:0> reaches the number of pulses corresponding to the access frequency corresponding to the block indicated by the signal RFA(BLOCK) input from the refresh address counter 160 (indicated by the signal ACCFREQ input from the row control unit 22), the refresh skip control unit 180 can also output the signal for resetting the count value to the default value (not shown in the figure) to the counter 170. Here, the signal ACCFREQ can also indicate each frequencies of the read/write access requirement for each blocks 0-3.

Figure 7:
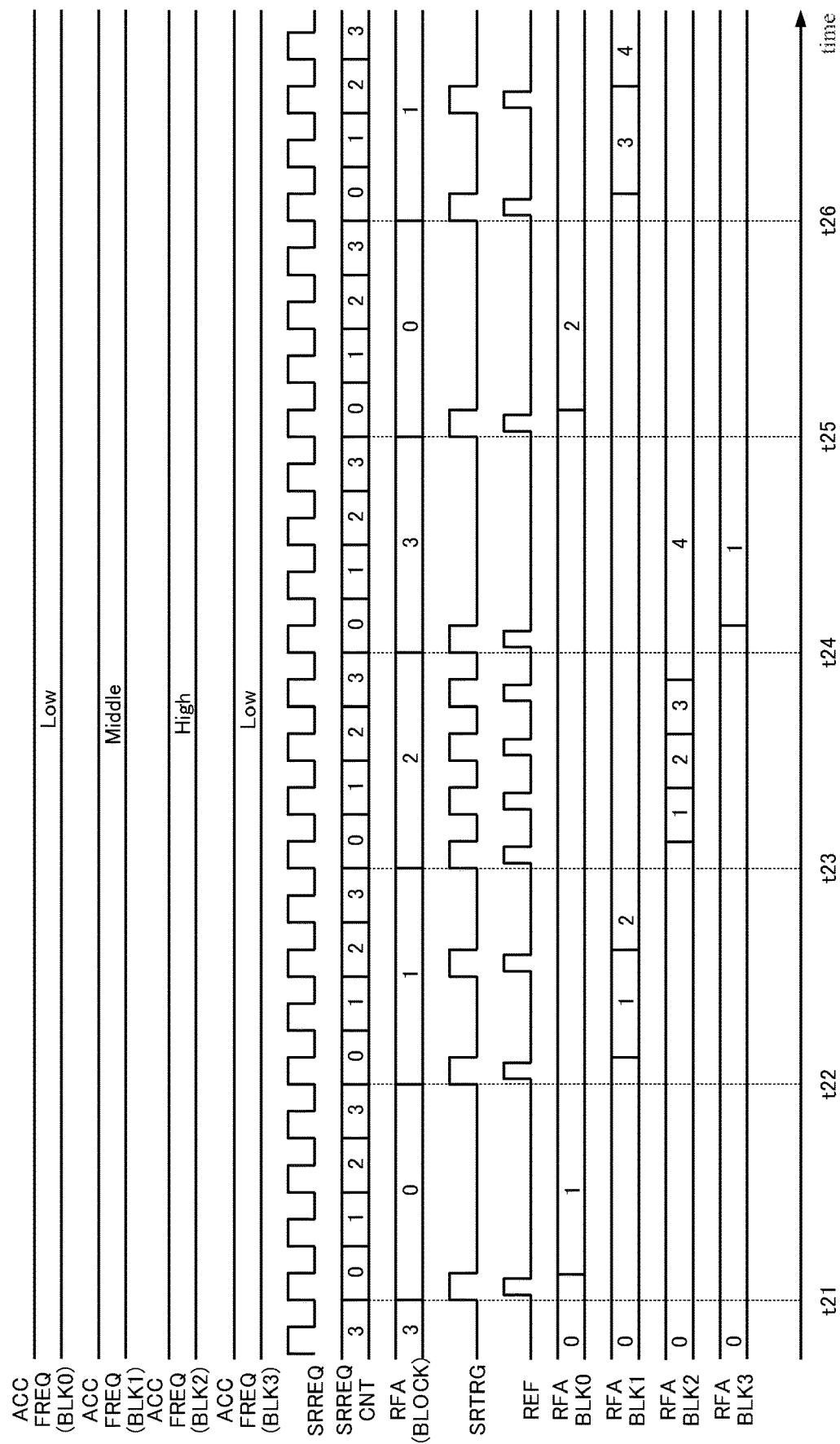
FIG. 7 is a timing chart showing changes in the voltage of the signal of every unit inside the semiconductor memory device according to the third embodiment.

FIG. 7 is a timing chart showing changes in the voltage of the signal of every unit inside the semiconductor memory device according to the present embodiment. Here, the following case will be described as one example: the access frequency ACCFREQ(BLK0) to the block 0 is low frequency (Low); the access frequency ACCFREQ(BLK3) to the block 3 is low frequency (Low); the access frequency ACCFREQ(BLK1) to the block 1 is middle frequency (Middle); the access frequency ACCFREQ(BLK2) to the block 2 is high frequency (High).

In addition, as shown in FIG. 7, the following case will be described here as one example: if the access frequency to the block is low frequency (Low), then one refresh signal REF is generated for every four refresh requirement signals SRREQ; if the access frequency to the block is middle frequency (Middle), then two refresh signals REF are generated for every four refresh requirement signals SRREQ; if the access frequency to the block is high frequency (High), then four refresh signals REF are generated for every four refresh requirement signals SRREQ.

At time t21, the refresh address counter 160 outputs the signal RFA(BLOCK) for designating the block 0 to be the target of the refresh operation to the refresh skip control unit 180. The refresh skip control unit 180 determines that the block 0 which the access frequency is low frequency has been designated to be the target of the refresh operation according to the signal RFA(BLOCK) input from the refresh address counter 160 and the signal ACCFREQ input from the row control unit 22.

Here, when the signal SRREQCNT<n:0> having the default value is input from the counter 170, the refresh skip control unit 180 can also output the refresh skip signal REFSKIP at the high level to the refresh skip unit 190. In addition, when the signal SRREQCNT<n:0> having the value which is not the default value is input from the counter 170, the refresh skip control unit 180 can also output the refresh skip signal REFSKIP at the low level to the refresh skip unit 190.

This way, when the signal SRREQCNT<n:0> having the default value is input to the refresh skip control unit 180, the refresh operation is performed on the row address indicated by the signal RFA BLK0 (in the figure, "0"). In addition, at the falling edge of the refresh signal REF, the refresh address counter 161 of the block 0 increments the row address indicated by the signal RFA BLK0 (in the figure, from "0" to "1").

This way, one refresh signal REF is generated (that is, the refresh operation is performed once) for the block 0 which the frequency of the read/write access during the predetermined period is low frequency (Low).

Next, at time t22, every time the refresh address counter 160 receives a certain number of refresh signals REF (here, the example is 4), the refresh address counter 160 increments the count value, and outputs the signal RFA(BLOCK) for designating the block 1 to be the target of the refresh operation to the refresh skip control unit 180. The refresh skip control unit 180 determines that the block 1 which the access frequency is middle frequency has been designated to be the target of the refresh operation according to the signal RFA(BLOCK) input from the refresh address counter 160 and the signal ACCFREQ input from the row control unit 22.

Here, when the signal SRREQCNT<n:0> having the default value is input from the counter 170, the refresh skip control unit 180 can also output the refresh skip signal REFSKIP at the high level to the refresh skip unit 190. In addition, when the signal SRREQCNT<n:0> having a certain value which is not the default value (here, the example is 2) is input from the counter 170, the refresh skip control unit 180 can also output the refresh skip signal REFSKIP at the high level to the refresh skip unit 190.

This way, when the signal SRREQCNT<n:0> having the default value is input to the refresh skip control unit 180, the refresh operation is performed on the row address indicated by the signal RFA BLK1 (in the figure, "0"). In addition, at the falling edge of the refresh signal REF, the refresh address counter 162 of the block 1 increments the row address indicated by the signal RFA BLK1 (in the figure, from "0" to "1").

In addition, when the signal SRREQCNT<n:0> having the certain value which is not the default value (here, the example is 2) is input to the refresh skip control unit 180, the refresh operation is performed on the row address indicated by the signal RFA BLK1 (in the figure, "1"), at the falling edge of the refresh signal REF, the refresh address counter 162 of the block 1 increments the row address indicated by the signal RFA BLK1 (in the figure, from "1" to "2").

This way, two refresh signal REF is generated (that is, the refresh operation is performed twice) for the block 1 which the frequency of the read/write access during the predetermined period is middle frequency (Middle).

Next, at time t23, every time the refresh address counter 160 receives a certain number of refresh signals REF (here, the example is 4), the refresh address counter 160 increments the count value, and outputs the signal RFA(BLOCK) for designating the block 2 to be the target of the refresh operation to the refresh skip control unit 180. The refresh skip control unit 180 determines that the block 2 which the access frequency is high frequency has been designated to be the target of the refresh operation according to the signal RFA(BLOCK) input from the refresh address counter 160 and the signal ACCFREQ input from the row control unit 22.

Here, every time the signal SRREQCNT<n:0> is input from the counter 170, the refresh skip control unit 180 can also output the refresh skip signal REFSKIP at the high level to the refresh skip unit 190.

This way, every time the SRREQCNT<n:0> is input to the refresh skip control unit 180, the refresh operations are performed on the row addresses indicated by the signal RFA BLK2 (in the figure, "0", "1", "2" and "3") in sequence. At this time, the refresh address counter 162 of the block 2 increments the row addresses indicated by the signal RFA BLK2 (in the figure, from "0" to "4").

This way, four refresh signal REF is generated (that is, the refresh operation is performed four times) for the block 2 which the frequency of the read/write access during the predetermined period is high frequency (High).

Next, at time t24, every time the refresh address counter 160 receives a certain number of refresh signals REF (here, the example is 4), the refresh address counter 160 increments the count value, and outputs the signal RFA(BLOCK) for designating the block 3 to be the target of the refresh operation to the refresh skip control unit 180. The refresh skip control unit 180 determines that the block 3 which the access frequency is low frequency has been designated to be the target of the refresh operation according to the signal RFA(BLOCK) input from the refresh address counter 160 and the signal ACCFREQ input from the row control unit 22.

In addition, the related processes of the refresh operation according to the block 3, is the same as the related processes of the refresh operation according to the block 0.

Next, at time t25, when the refresh address counter 160 receives a certain number of refresh signals REF (here, the example is 4), and the count value of the refresh address counter 160 reaches a certain threshold value (here, the example is 3), the refresh address counter 160 resets the count value to the default value (here, the example is 0), and outputs the signal RFA(BLOCK) for designating the block 0 to be the target of the refresh operation to the refresh skip control unit 180. In this case, when the refresh signal REF is input, the refresh address counter 161 of the block 0 increments the row address indicated by the signal RFA BLK0 (in the figure, from "1" to "2").

Next, at time t26, when the refresh address counter 160 receives a certain number of refresh signals REF (here, the example is 4), the refresh address counter 160 increments the count value by 1, and outputs the signal RFA(BLOCK) for designating the block 1 to be the target of the refresh operation to the refresh skip control unit 180. In this case, when the refresh signal REF is input, the refresh address counter 162 of the block 1 increments the row address indicated by the signal RFA BLK1 (in the figure, from "2" to "4").

In addition, in the present embodiment, one example describes that in case when the block to be accessed is low frequency (Low), and the value of the signal SRCNT<n:0> is the default value (here, the example is 0); and in case when the block to be accessed is middle frequency (Middle), and the value of the signal SRCNT<n:0> is the default value (here, the example is 0) or the certain value (here, the example is 2), the refresh operation will be performed; however, the present invention is not limited to this. For example, the refresh operation can also be performed when the value of the signal SRCNT<n:0> is any other value.

As described above, according to the present embodiment of the semiconductor memory device, can control the block with high frequency of the read/write access requirement in the blocks 0-3, to shorten the interval of the refresh operation; and control the block with low frequency of the read/write access requirement in the blocks, to lengthen the interval of the refresh operation. Therefore, the number of times that the refresh operation needs to be performed can be reduced, at least compared to cases where refresh operations are performed for all memories at the shortest interval. This helps ensure that there is no increase in power consumption on the part of the semiconductor memory device.

Next, the modified embodiment of the third embodiment will be described. In the third embodiment described above, one example describes that refresh address counters 161-164 are respectively configured in blocks 0-3; however, the present invention is not limited to this. For example, the control unit 10 can also control the interval of the refresh operation of each of the blocks without using the refresh address counters 161-164.

Figure 8:
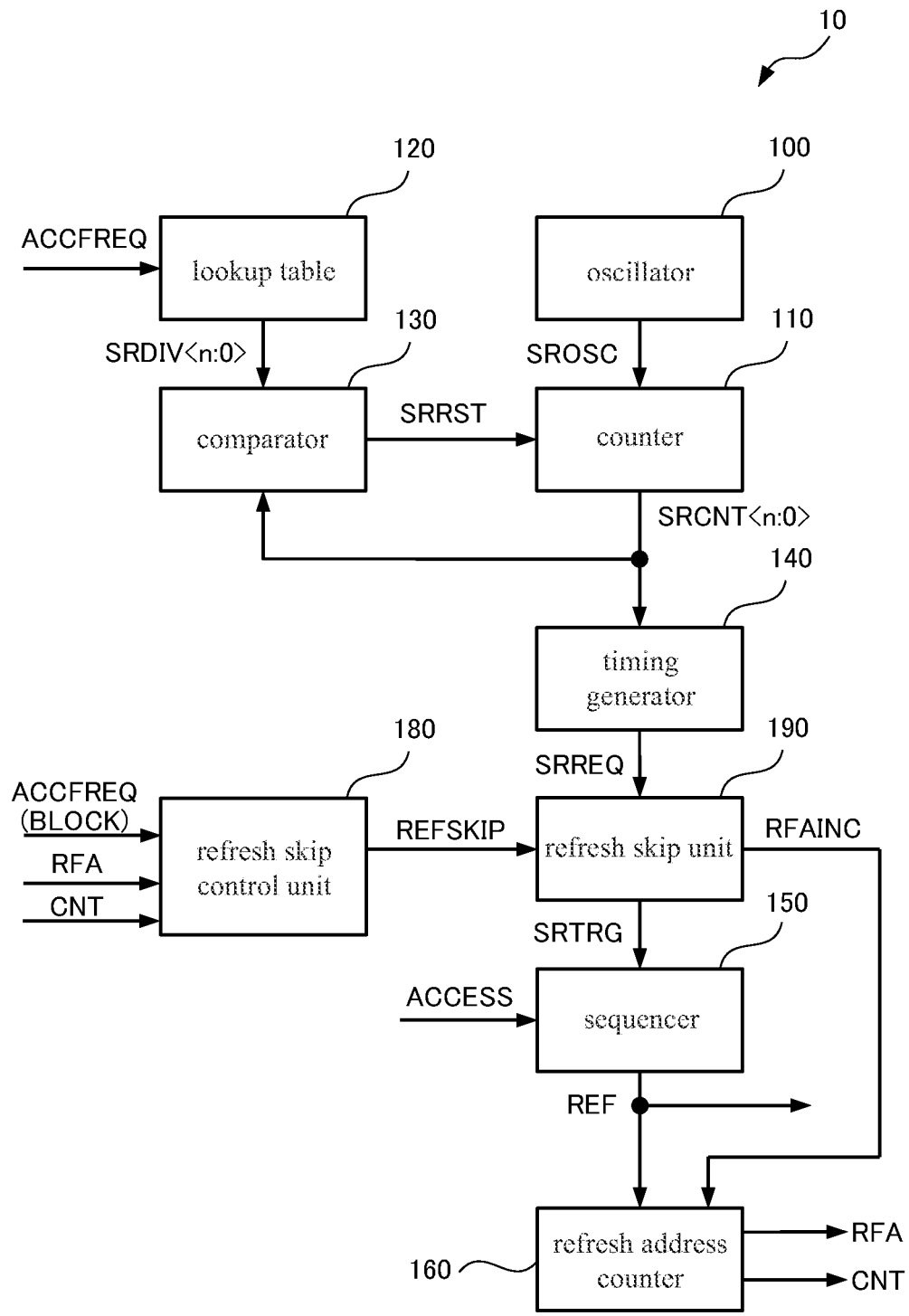
FIG. 8 is a block diagram showing the configuration of the control unit in the semiconductor memory device according to the modified embodiment of the present invention.

FIG. 8 shows the configuration of the control unit 10 in the semiconductor memory device according to the modified embodiment. In this modified embodiment, the control unit 10 comprises an oscillator 100, a counter 110, a lookup table 120, a comparator 130, a timing generator 140, a sequencer 150, a refresh address counter 160, a refresh skip control unit 180 and a refresh skip unit 190. Here, the configurations of the oscillator 100, the counter 110, the lookup table 120, the comparator 130, the timing generator 140 and the sequencer 150 are the same as the first embodiment described above.

In this modified embodiment, the refresh address counter 160 outputs the signal RFA to the row control unit 22, which is the same as in the first embodiment described above. In addition, in this modified embodiment, the refresh address counter 160 also outputs the signal RFA to the refresh skip control unit 180. In addition, every time the refresh operation is performed, and every time the signal RFAINC for incrementing the row address that has become the target of the refresh operation to the refresh skip unit 190, the refresh address counter 160 increases the row address that has become the target of the refresh operation. In addition, in this modified embodiment, for example, the row address can also be incremented so as to circulate within a certain range (for example, from 0 to 3).

In addition, every time the row addresses in the memory cell array 24 are fully counted once, the refresh address counter 160 increments the orbit times of all row addresses, and outputs the signal CNT indicating the orbit times to the refresh skip unit 180. Here, for example, the orbit times can also be incremented so as to circulate within a certain range (for example, from 0 to 3). In addition, although not shown in FIG. 8, the refresh address counter 160 can also output the signal RFA(BLOCK) for designating the block to be the target of the refresh operation to the refresh skip control unit 180, which is the same as in the second embodiment described above.

In this modified embodiment, the refresh skip control unit 180 outputs the refresh skip signal REFSKIP to the refresh skip unit 190 according to the access frequency corresponding to the block indicated by the signal RFA(BLOCK) input from the refresh address counter 160 (the signal ACCFREQ (BLOCK) input from the row control unit 22), and the signals RFA and CNT input from the refresh address counter 160. The refresh skip signal REFSKIP indicates whether the refresh operation will be performed on the row address indicated by the signal RFA or not.

Here, for example, the refresh skip control unit 180 can also use the lookup table shown in FIG. 9 to determine whether the refresh operation will be performed on the row address indicated by the signal RFA or not. FIG. 9 (a)-(c) shows the configuration of the lookup table. As shown in FIG. 9, the lookup table can refer to the information for indicating whether the refresh operation will be performed or not (skip the refresh operation) according to the value of each signals RFA (in the figure, from 0 to 3) and the value of each signals CNT (in the figure, from 0 to 3).

FIG. 9(a) shows an example of the relationship between the value of the signal CNT and the value of the signal RFA if the access frequency to the block indicated by the signal RFA(BLOCK) is low frequency (Low). In the example shown in FIG. 9(a), when the value of the signal CNT is 0, the refresh operation will be performed on the row address No. 0 (the value of RFA<1:0> is "0"); and the refresh operation will not be performed on the row addresses No. 1-3 (the value of RFA<1:0> is "1"-"3"). In addition, when the value of the signal CNT is 1, the refresh operation will be only performed on the row address No. 1; when the value of the signal CNT is 2, the refresh operation will be only performed on the row address No. 2; when the value of the signal CNT is 3, the refresh operation will be only performed on the row address No. 3. In other words, if the access frequency to the block is low frequency (Low), every time all addresses in the memory cell array 24 are orbited once, the refresh operation will be performed on one address among the addresses 0-3 in the block. By orbiting four times, the refresh operation will be performed on all addresses 0-3 in the block.

FIG. 9(b) shows an example of the relationship between the value of the signal CNT and the value of the signal RFA if the access frequency to the block indicated by the signal RFA(BLOCK) is middle frequency (Middle). In the example shown in FIG. 9(b), when the value of the signal CNT is 0, the refresh operation will be performed on the row addresses No. 0 and 2 (the values of RFA<1:0> are "0" and "2"); and the refresh operation will not be performed on the row addresses No. 1 and 3 (the value of RFA<1:0> is "1" and "3"). In addition, when the value of the signal CNT is 1, the refresh operation will be only performed on the row addresses No. 1 and 3; when the value of the signal CNT is 2, the refresh operation will be only performed on the row addresses No. 0 and 2; when the value of the signal CNT is 3, the refresh operation will be only performed on the row addresses No. 1 and 3. In other words, if the access frequency to the block is middle frequency (Middle), every time all addresses in the memory cell array 24 are orbited once, the refresh operation will be performed on two addresses among the addresses 0-3 in the block. By orbiting twice, the refresh operation will be performed on all addresses 0-3 in the block.

FIG. 9(c) shows an example of the relationship between the value of the signal CNT and the value of the signal RFA if the access frequency to the block indicated by the signal RFA(BLOCK) is high frequency (High). In the example shown in FIG. 9(c), when the value of the signal CNT is 0, the refresh operation will be performed on the row addresses No. 0-3 (the value of RFA<1:0> is "0"-"3"). In addition, when the values of the signal CNT are 1-3, the refresh operation will also be performed on the row addresses No. 0-3. In other words, if the access frequency to the block is high frequency (High), every time all addresses in the memory cell array 24 are orbited once, the refresh operation will be performed on all addresses 0-3 in the block.

The refresh skip control unit 180 uses the lookup table shown in FIG. 9(a)-(c) to determine whether the refresh operation will be performed on the row address indicated by the signal RFA or not. Then, if it is determined that the refresh operation is performed, then the refresh skip control unit 180 outputs the refresh skip signal REFSKIP at the high level to the refresh skip unit 190; if it is determined that the refresh operation is not performed (skip), then the refresh skip control unit 180 outputs the refresh skip signal REFSKIP at the low level to the refresh skip unit 190.

In this modified embodiment, if the refresh skip signal REFSKIP at the high level is input from the refresh skip control unit 180, then the refresh skip control unit 180 converts the refresh requirement signal SRREQ output from the timing generator 140, to the refresh trigger signal SRTRG at the high level, and outputs the refresh trigger signal SRTRG to the sequencer 150. In addition, if the refresh skip signal REFSKIP at the low level is input from the refresh skip control unit 180, then the refresh skip control unit 180 converts the refresh requirement signal SRREQ output from the timing generator 140, to the refresh trigger signal SRTRG at the low level, and outputs the refresh trigger signal SRTRG to the sequencer 150, and outputs the signal RFAINC to the refresh address counter 160.

FIG. 10-12 is a timing chart showing changes in the voltage of the signal of every unit inside the semiconductor memory device according to this modified embodiment. In addition, the following case will be described here as one example: the access frequencies ACCFREQ(BLK0) to the blocks 0 and 3 are low frequency (Low); the access frequency (ACCFREQ(BLK1) to the block 1 is middle frequency (Middle); the access frequency ACCFREQ(BLK2) to the block 2 is high frequency (High).

FIG. 10 shows one example that performs the refresh operation on the row addresses 0-3 of the block 0. Firstly, the refresh address counter 160 outputs the signal CNT indicating the first orbit, the signal RFA indicating that the target of the refresh operation is the row address No. 0, and the signal RFA(BLOCK) indicating that the target of the refresh operation is the block 0, to the refresh skip control unit 180. In this case, the refresh skip control unit 180 uses the signals input from the refresh address counter 160, and the lookup table shown in FIG. 9(a), to determine that the refresh operation will be performed on the row address No. 0. Then, the refresh skip control unit 180 outputs the refresh skip signal REFSKIP at the high level to the refresh skip unit 190. At this time, the refresh skip unit 190 converts the refresh requirement signal SRREQ output from the timing generator 140, to the refresh trigger signal SRTRG at the high level, and outputs the refresh trigger signal SRTRG to the sequencer 150. Then, by outputting the refresh signal REF from the sequencer 150, the refresh operation will be performed on the row address No. 0.

In addition, when the refresh signal REF is input from the sequencer 150, the refresh address counter 160 outputs the signal RFA indicating that the targets of the refresh operation are the row addresses No. 1-3, to the refresh skip control unit 180. Here, the refresh skip control unit 180 uses the signals input from the refresh address counter 160, and the lookup table shown in FIG. 9(a), to determine that the refresh operation will not be performed on the row addresses No. 1-3. Then, the refresh skip control unit 180 outputs the refresh skip signal REFSKIP at the low level to the refresh skip unit 190. At this time, the refresh skip unit 190 converts the refresh requirement signal SRREQ output from the timing generator 140, to the refresh trigger signal SRTRG at the low level, and outputs the refresh trigger signal SRTRG to the sequencer 150. In addition, the refresh skip unit 190 outputs the signal RFAINC for incrementing the row address that has become the target of the refresh operation to the refresh address counter 160. Then, by outputting the refresh signal REF at the low level from the sequencer 150, the refresh operation of the row addresses No. 1-3 will be skipped.

Figure 10A:
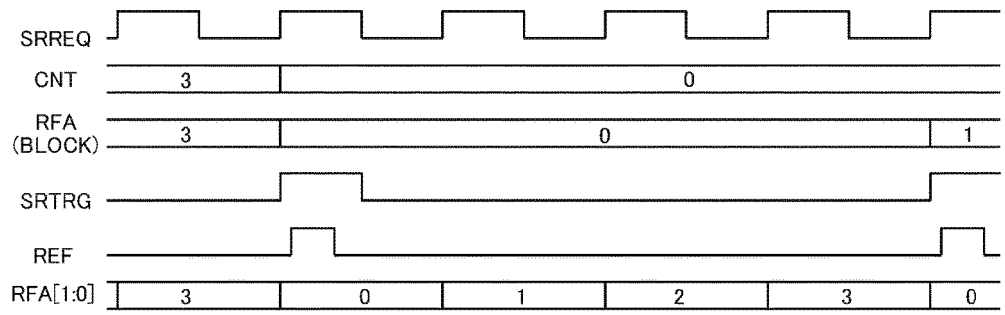
FIGS. 10(a)-10(d), 11(a)-11(d) and 12(a)-12(d) are timing charts showing changes in the voltage of the signal of every unit inside the semiconductor memory device according to the modified embodiment.
Figure 10B:
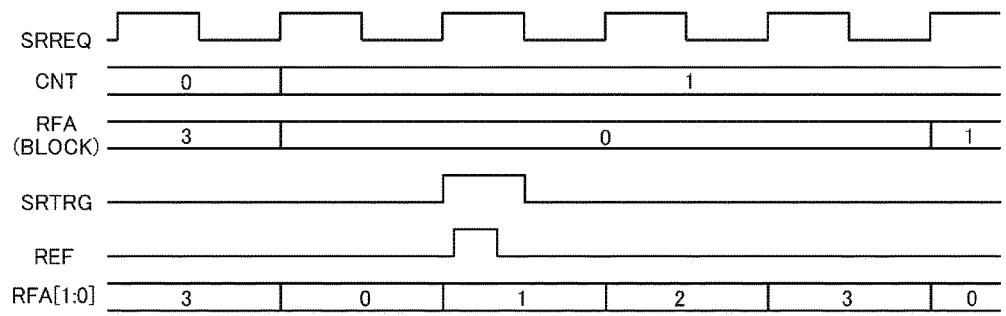
Figure 10C:
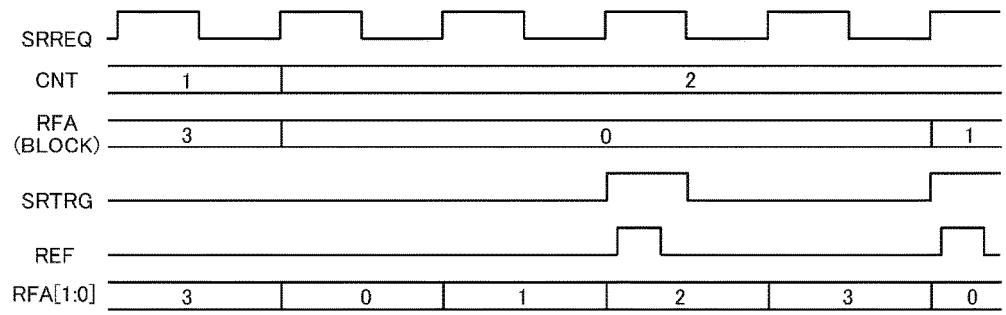
Figure 10D:
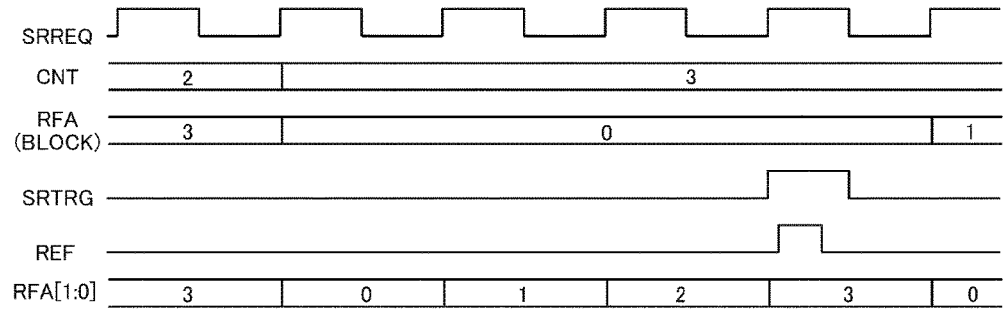

This way, as shown in FIG. 10(a), in the zeroth orbit (the value of the signal CNT is "0"), the refresh operation will be performed on the row address No. 0 (the value of the RFA[1:0] is "0") in the block 0 (the value of the signal RFA(BLOCK) is 0). In addition, as shown in FIG. 10(b), in the first orbit (the value of the signal CNT is "1"), the refresh operation will be performed on the row address No. 1 (the value of the RFA[1:0] is "1") in the block 0. In addition, as shown in FIG. 10(c), in the second orbit (the value of the signal CNT is "2"), the refresh operation will be performed on the row address No. 2 (the value of the RFA[1:0] is "2") in the block 0. Then, as shown in FIG. 10(d), in the third orbit (the value of the signal CNT is "3"), the refresh operation will be performed on the row address No. 3 (the value of the RFA[1:0] is "3") in the block 0.

Therefore, if the access frequency to the block 0 is low frequency (Low), every time all addresses in the memory cell array 24 are orbited once, the refresh operation will be performed on one address among the addresses 0-3 in the block 0. By orbiting four times, the refresh operation will be performed on all addresses 0-3 in the block 0.

Figure 11A:
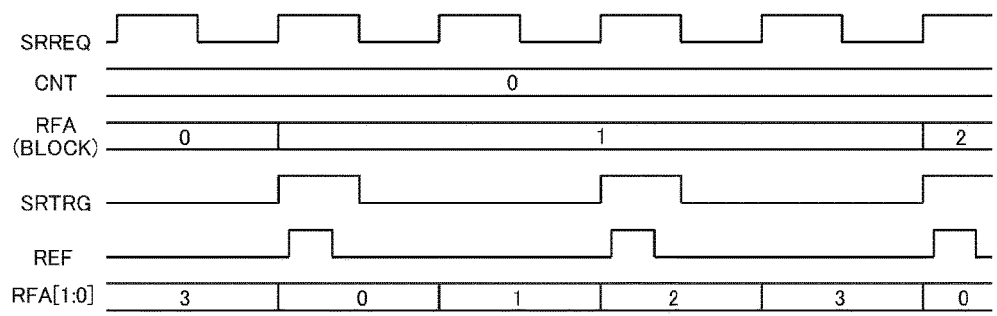
Figure 11B:
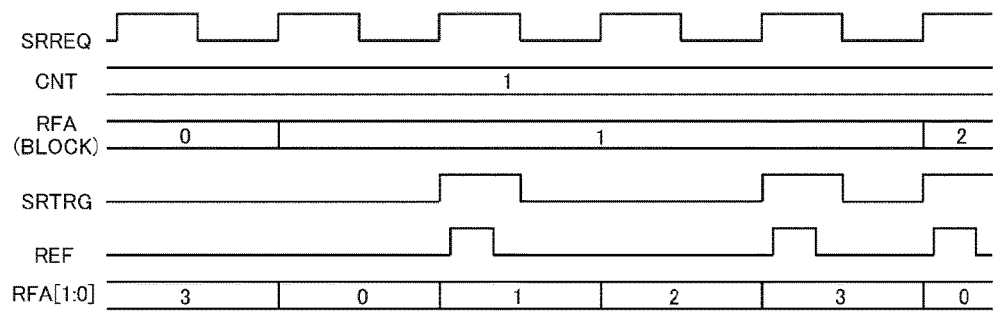
Figure 11C:
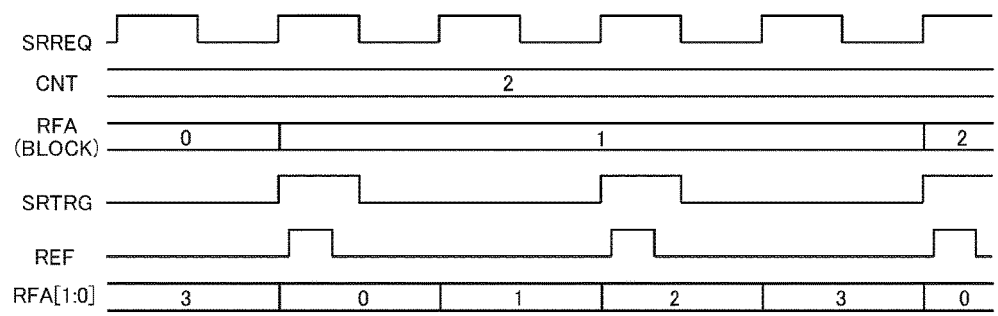
Figure 11D:
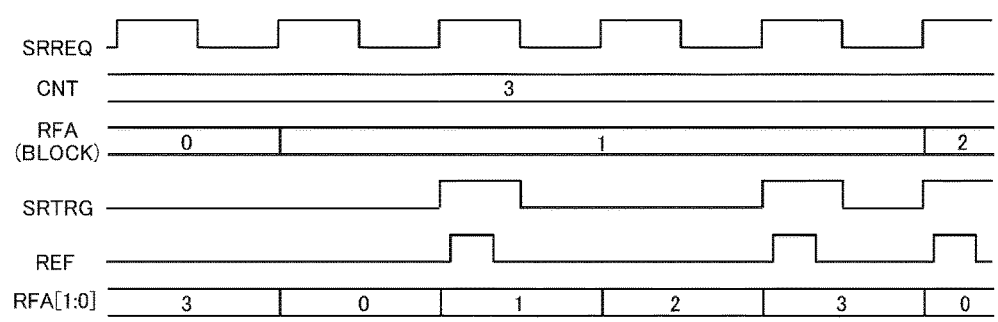

FIG. 11 shows one example that performs the refresh operation on the row addresses 0-3 of the block 1, as shown in FIG. 11(a), in the zeroth orbit (the value of the signal CNT is "0"), the refresh operation will be performed on the row addresses No. 0 (the value of the RFA[1:0] is "0") and No. 2 (the value of the RFA[1:0] is "2") in the block 1 (the value of the signal RFA(BLOCK) is 1). Then, as shown in FIG. 11(b), in the first orbit (the value of the signal CNT is "1"), the refresh operation will be performed on the row addresses No. 1 (the value of the RFA[1:0] is "1") and No. 3 (the value of the RFA[1:0] is "3") in the block 1. Then, as shown in FIG. 11(c), in the second orbit (the value of the signal CNT is "2"), the refresh operation will be performed on the row addresses No. 0 (the value of the RFA[1:0] is "0") and No. 2 (the value of the RFA[1:0] is "2") in the block 1. Then, as shown in FIG. 11(d), in the third orbit (the value of the signal CNT is "3"), the refresh operation will be performed on the row addresses No. 1 (the value of the RFA[1:0] is "1") and No. 3 (the value of the RFA[1:0] is "3") in the block 1.

This way, if the access frequency to the block 1 is middle frequency (Middle), every time all addresses in the memory cell array 24 are orbited once, the refresh operation will be performed on two addresses among the addresses 0-3 in the block 1. By orbiting twice, the refresh operation will be performed on all addresses 0-3 in the block 1.

Figure 12A:
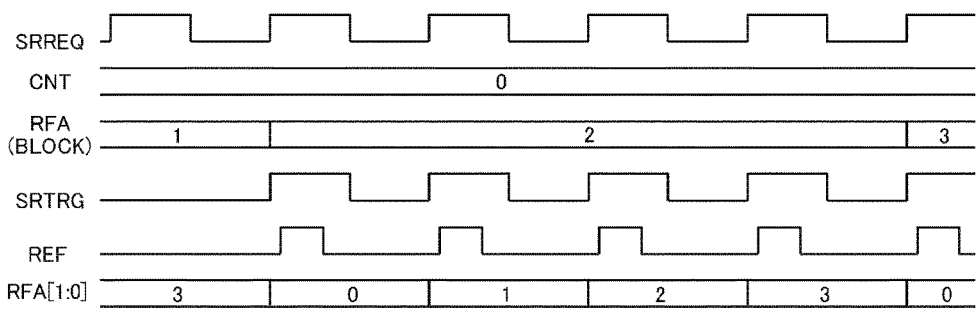
Figure 12B:
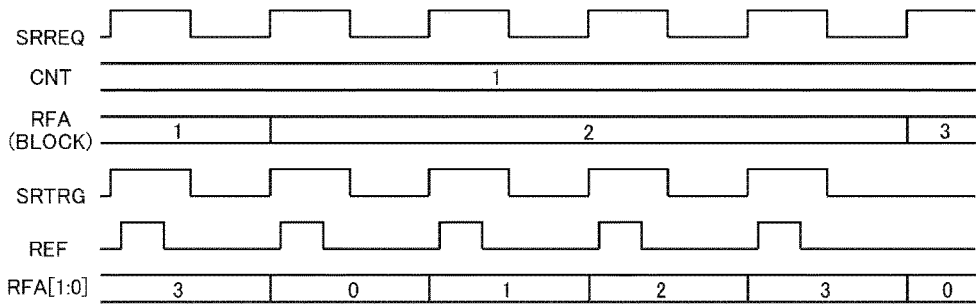
Figure 12C:
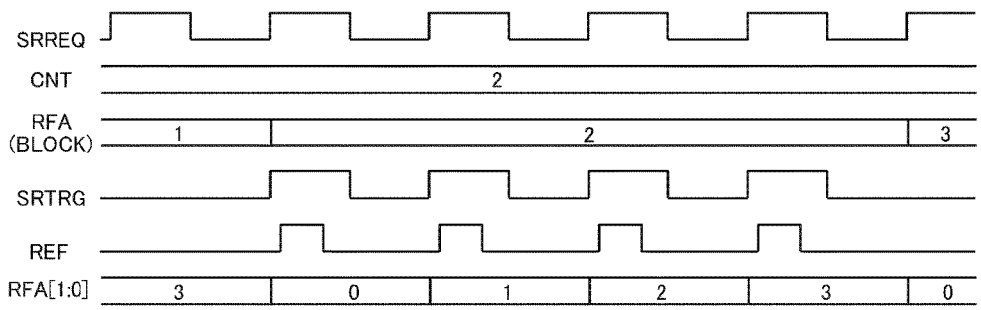
Figure 12D:
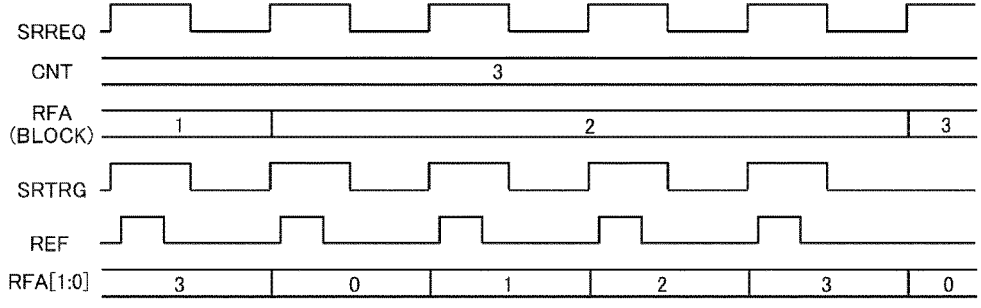

FIG. 12 shows one example that performs the refresh operation on the row addresses 0-3 of the block 2, as shown in FIG. 12(a), in the zeroth orbit (the value of the signal CNT is "0"), the refresh operation will be performed on the row addresses No. 0-3 (the value of the RFA[1:0] is "0"-"3") in the block 2 (the value of the signal RFA(BLOCK) is 2). Then, as shown in FIG. 12(b)-(d), from the first orbit to the third orbit (the value of the signal CNT is "1"-"3"), the refresh operation will also be performed on the row addresses No. 0-3 (the value of the RFA[1:0] is "0"-"3") in the block 2.

This way, if the access frequency to the block 2 is high frequency (High), every time all addresses in the memory cell array 24 are orbited once, the refresh operation will be performed on all addresses 0-3 in the block 2.

In addition, the related processes of the refresh operation according to the block 3, is the same as the related processes of the refresh operation according to the block 0.

In addition, in the modified embodiment, one example describes that four row addresses 0-3 are set per four blocks 0-3; however, the present invention is not limited to this. For example, n row addresses (n is a number other than four) can also be set per four blocks 0-3. As described above, according to this modified embodiment of the semiconductor memory device, the functions and the effects are the same as those of the third embodiment.

The embodiments and the modified embodiment described above are described in order to easily understand the present invention, and are not described in order to limit the present invention. Therefore, the elements disclosed in the above embodiments are intended to comprise all the design modifications or equivalents pertaining to the technical field of the present invention. For example, in the third embodiment and the modified embodiment described above, one example describes that the control unit 10 controls the interval of the refresh operation per four blocks; however, the present invention is not limited to this. For example, the control unit 10 can also control the interval of the refresh operation per n blocks, wherein n is a number other than four.

In addition, in the embodiments described above, one example describes that the access frequencies are classified into three classes (low frequency, middle frequency and high frequency); however, the present invention is not limited to this. For example, the access frequencies can also be classified into two classes or (more than) four classes.

What is claimed is:

1. A semiconductor memory device, comprising:
    a control unit, controlling an interval of a refresh operation for a memory;
    wherein the higher a frequency of a read/write access requirement to the memory during a predetermined period is, the shorter the interval of the refresh operation for the memory is controlled by the control unit;
    wherein each of a plurality of blocks comprises a refresh address counter, and each refresh address counter designates the row address that the refresh operation is performed on according to a refresh requirement.

2. The semiconductor memory device as claimed in claim 1,
    wherein the higher the frequency of the read/write access requirement to the memory during the predetermined period is, the shorter an interval of the refresh requirement is controlled by the control unit;
    wherein the refresh requirement is generated at regular intervals in order to perform a refresh operation on the memory.

3. The semiconductor memory device as claimed in claim 1,
    wherein the higher the frequency of the read/write access requirement to the memory during the predetermined period is, the more the number of times that the refresh operation is performed is increased by the control unit according to the refresh requirement;
    wherein the refresh requirement is generated at regular intervals in order to perform a refresh operation on the memory.

4. The semiconductor memory device as claimed in claim 3,
    wherein the control unit respectively controls the interval of the refresh operation of each of the blocks in a continuous row address.

5. The semiconductor memory device as claimed in claim 4,
    wherein the control unit controls the refresh operations to be performed on the corresponding row address designated by the refresh address counters of the corresponding blocks.

6. A semiconductor memory device, comprising:
    a control unit, controlling an interval of a refresh operation for a memory;
    wherein the higher a frequency of a read/write access requirement to the memory during a predetermined period is, the shorter the interval of the refresh operation for the memory is controlled by the control unit;
    wherein the control unit further comprises:
        a refresh address counter, designating the row address where the refresh operation is performed according to a refresh requirement;
        wherein the control unit controls the refresh operation to be performed on the corresponding row address designated by the refresh address counter.

7. The semiconductor memory device as claimed in claim 6,
    wherein the control unit controls the refresh operation to be performed on the corresponding row address designated by the refresh address counter once the row address designated by the refresh address counter matches any one of a plurality of predetermined row addresses;

wherein the predetermined row addresses are set to be larger when the frequency of the read/write access requirement to the corresponding block is higher.

8. The semiconductor memory device as claimed in claim 7, wherein when the same block is selected to be a target of the refresh operation, the predetermined row addresses are set to be changeable.

9. The semiconductor memory device as claimed in claim 1, wherein at every predetermined period, the control unit controls the interval of the refresh operation for the memory according to the frequency of the read/write access requirement to the memory during the predetermined period.

10. The semiconductor memory device as claimed in claim 1, wherein all the frequencies of the read/write access requirement to the memory are classified into a certain number.

\* \* \* \* \*